United States Patent
Simmonds

(10) Patent No.: US 8,082,285 B2
(45) Date of Patent: Dec. 20, 2011

(54) DIGITAL SINE WAVE GENERATOR

(75) Inventor: Harold Thomas Simmonds, Stewartsville, NJ (US)

(73) Assignee: Agere Systems Inc., Allentown, PA (US)

( * ) Notice: Subject to any disclaimer, the term of this patent is extended or adjusted under 35 U.S.C. 154(b) by 1084 days.

(21) Appl. No.: 11/982,264

(22) Filed: Oct. 31, 2007

(65) Prior Publication Data
US 2009/0108883 A1   Apr. 30, 2009

(51) Int. Cl.
*G06F 1/02*   (2006.01)

(52) U.S. Cl. ........................................ 708/276

(58) Field of Classification Search .................... 708/276
See application file for complete search history.

(56) References Cited

U.S. PATENT DOCUMENTS
4,542,533 A * 9/1985 Parker .................... 455/182.2
* cited by examiner

*Primary Examiner* — Tan V Mai

(57) ABSTRACT

In accordance with described exemplary embodiments, correction is inserted into the feedback loop of a second order resonator used at the time of frequency transition. The correction is based upon parameters generated from a desired output signal frequency and a desired sampling frequency. The correction is generated to maintain i) constant amplitude, ii) continuous phase, and iii) the same sampling frequency during the frequency transition.

16 Claims, 1 Drawing Sheet

DIGITAL SINE WAVE GENERATOR

BACKGROUND OF THE INVENTION

1. Field of the Invention

The present invention relates to digital sine wave generation, and, in particular, to frequency modulation for a digital sine wave generator with continuous phase and constant amplitude.

2. Description of the Related Art

Many communication applications require generation of a digital sine wave for which the frequency can be arbitrarily changed at any time, while maintaining i) constant amplitude, ii) continuous phase, and iii) the same sampling frequency. The digital sine wave generator output is commonly employed for data modulation. One common application employing sine wave generators is Frequency Shift Keyed (FSK) modulation used for caller ID in telephony, and other common applications include FM, MSK, and GMSK modulation. Ordinary second order digital resonators incorporating a digital sine wave generator do not maintain constant amplitude, continuous phase, and the same sampling frequency of the output signal from the digital sine wave generator. In such a resonator, changing a parameter controlling the output signal frequency of the digital sine wave generator causes the output signal amplitude to change. The amplitude change can be very large, and is dependent upon the phase of the output signal at the time the change occurs.

In order to overcome these shortcomings of the resonator, digital sine wave generators currently exhibit one or more limitations. Modulation of the sampling frequency requires a given implementation to allow for variable frequency dividers or frequency synthesizers that add significant complexity to the implementation's design. Sine wave lookup tables also require sizeable memory storage to achieve accuracy. Large sine wave lookup tables also add computational overhead to calculate i) the memory address stepping increments used to produce a sine wave at the desired frequency and ii) the starting address to satisfy phase continuity requirements. Finally, switching between multiple resonators requires an implementation to support as many resonators as necessary to accommodate the anticipated frequencies used. Switching between multiple resonators requires some technique to accomplish switching without phase discontinuity, since independent resonators operating at different frequencies are not continually phase aligned.

SUMMARY OF THE INVENTION

In one embodiment, the present invention allows for changing an oscillating signal from a first frequency to a second frequency by generating, by a resonator, the oscillating signal at the first frequency based on a first set of parameters. A correction value is generated for the oscillating signal at a second frequency based on the first set of parameters and a second set of parameters; the oscillating signal is switched from the first frequency to the second frequency at a current sample increment; and the correction value is applied to the oscillating signal at a subsequent sample increment.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with exemplary embodiments of the present invention, correction is inserted into the feedback loop of a second order resonator used at the time of frequency transition. The correction is based upon parameters generated from a desired output signal frequency and a desired sampling frequency at the moment of the frequency transition. The correction is generated to maintain i) constant amplitude, ii) continuous phase, and iii) the same sampling frequency during the frequency transition.

Figure 1:
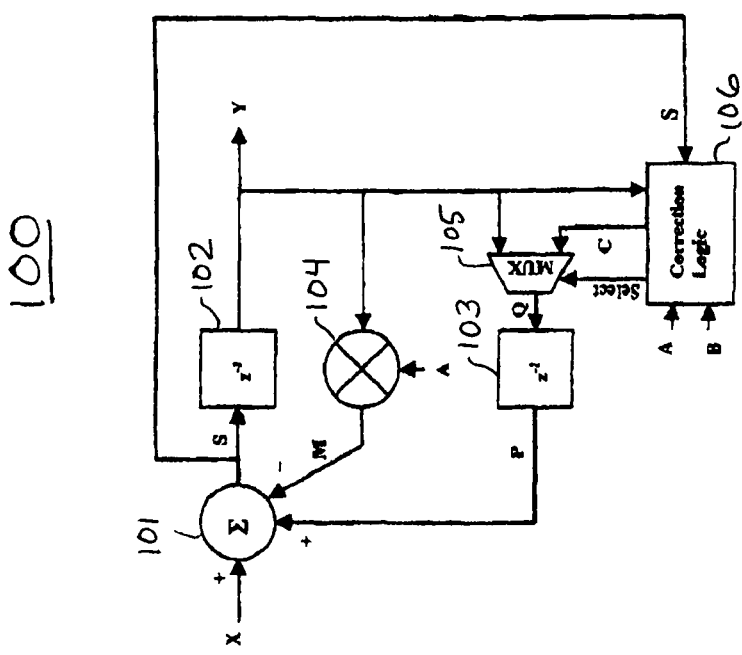
FIG. 1 shows a block diagram of a modified second order resonator (MSOR) operating in accordance with an exemplary embodiment of the present invention.

FIG. 1 shows a block diagram of a modified second order resonator (MSOR) 100 operating in accordance with an exemplary embodiment of the present invention. MSOR 100 comprises combiner 101, delay elements 102 and 103, multiplier 104, multiplexer (MUX) 105, and correction logic 106.

MSOR 100 represents a second order resonator modified in accordance with the teachings of the present invention by addition of MUX 105 and correction logic 106, along with corresponding input signals as described subsequently. X, S, Y, C, Q, P, M, A, Select, and B represent signal values at various nodes of MSOR 100. Delay elements 102 and 103 are clocked at the sampling frequency $f_s$. MUX 105 acts as a switch providing, based on the input signal Select, either the value at Y or the value at C as output value Q.

When MUX 105 receives Select signal to select input signal Y as the output value Q, MSOR 100 operates as a standard second order resonator (referred to herein as operation in "Configuration I". In configuration I, the z domain transfer function from input signal X to output signal Y is, as known in the art, given by equation (1):

$$H(z) = z^{-1}/(1 - A_k z^{-1} + z^{-2}), \qquad (1)$$

where $A_0$ is given by equation (2):

$$A_k = 2\cos(2\pi f_k/f_s), \qquad (2)$$

$f_k$ is the desired output frequency, and $f_s$ is the sampling frequency.

When MUX 105 provides value Y as output value Q, oscillation at an initial output signal frequency $f_k = f_0$ is started by i) setting the initial value $A_0$ as given by equation (2), ii) applying initial value $A_0$ to multiplier 104 as input value A, and (iii) applying an impulse of amplitude $B_k = B_0$ as input value X. Values Y and P are initialized to zero. The amplitude $B_k = B_0$ is applied to combiner 101 as input value X as given in equation (3):

$$B_k = b\sin(2\pi f_k/f_s), \qquad (3)$$

where the value b is the desired peak amplitude of the output sine wave of MSOR 100.

Correction logic 106 receives initial values $A_0$ and $B_0$ for storage and are used as described subsequently to generate a correction value when output signal frequency changes.

While oscillation occurs, the output signal frequency can be changed to a new frequency, $f_1$, at a current sampling increment by applying new values $A_1$ and $B_1$ as input values A and B to correction logic 106. For the following description, "current sample increment" and "next sample increment" are used to distinguish operations at the sample increment when initiating the frequency change and the following sample increment when a correction is applied in the feedback loop to maintain amplitude, phase and sampling frequency of output signal Y, respectively. New values $A_1$ and $B_1$ are generated as given in equations (2) and (3) using $f_1$ in place of $f_0$. Multiplier 104 continues to receive initial value $A_0$ to maintain value S at a constant value until the next sampling increment.

Correction logic 106 generates a correction value C, as described subsequently, to maintain i) constant amplitude, ii) continuous phase, and iii) the same sampling frequency. MUX 105 receives Select signal to select input signal value C as the output value Q, MSOR 100 operates in accordance with embodiments of the present invention (referred to herein as operation in "Configuration II"). Consequently, at the next sample increment by action of delay 103, the value Q (correction value C) is passed as output value P of delay 103 to combiner 101 and the new value $A_1$ is applied to multiplier 104. The previous value at S (generated at the current sample increment), which remains constant when applying frequency change and the correction value C during the current, and next sample increments, is passed from delay 102 as output value Y.

When this operation is completed at the next sample increment, the values S, Y, M, and P are at desired values to maintain constant amplitude at the new frequency. Since the new value Y is the same as it would have been at the initial frequency ($f_0$), and since the amplitude remains the same at the new frequency ($f_1$), the value Y corresponds to the same place in the output signal waveform at both $f_0$ and $f_1$, thus maintaining phase continuity.

Once the correction is applied at the next sample increment, MUX 105 then returns to operation as a standard second order resonator at the following sample increment, and remains in that configuration until the next time the frequency is to be changed. Consequently, at the following sample increment, MUX 105 receives Select signal to select input signal Y as the output value Q, and MSOR 100 operates in Configuration I.

Generation of correction value C by correction logic 106 is now described. Correction logic 106 implements the function:

$$C = \left(\frac{S_0 A_1}{2}\right) - \left(\frac{B_1}{B_0}\right)\left[\left(\frac{S_0 A_0}{2}\right) - Y_0\right] \tag{4}$$

where $S_0$, $B_0$, $A_0$, and $Y_0$ are the values S, B, A, and Y at frequency $f_0$ before the correction value C is applied. ($A_1$ and $B_1$) are the calculated values of A and B at the new frequency $f_1$ based upon equations (2) and (3).

Figure 2:
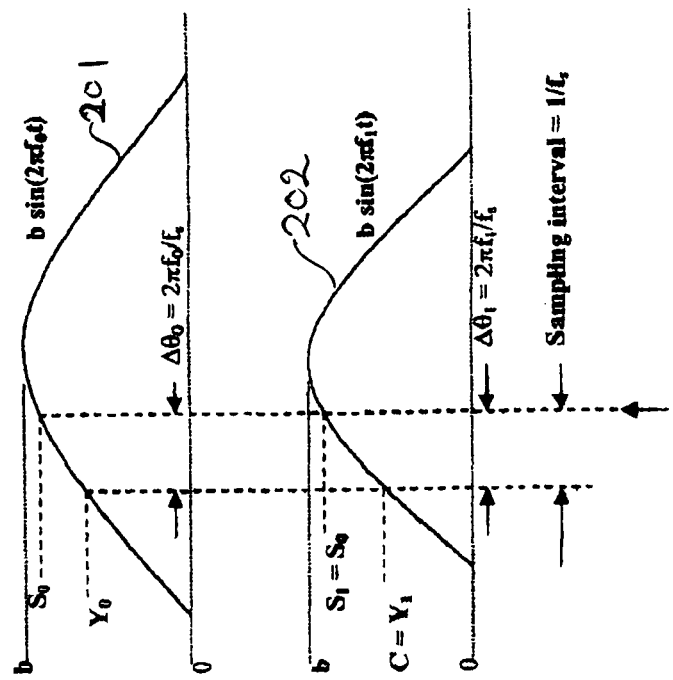
FIG. 2 shows a pair of desired output waveforms for the MSOR of FIG. 1 at two frequencies.

FIG. 2 shows a pair of desired output waveforms for the MSOR 100 of FIG. 1 at two frequencies, $f_0$ and $f_1$. Equation 4 is derived as follows, in reference to FIG. 1 and FIG. 2.

FIG. 2 shows portions of sine waves 201 and 202 of equal amplitude b at two arbitrary frequencies, $f_0$ and $f_1$. The sine waves are aligned such that the phases of the two waveforms are equal at arbitrary phase $\theta_{S1} = \theta_{S\theta}$ for value S from combiner 101 of FIG. 1. Since the amplitudes of sine waves 201 and 202 are equal, $S_1 = S_0$ at phase $\theta_{S1} = \theta_{S\theta}$.

$Y_0$ represents the value Y in FIG. 1 when the value S is $S_0$ as MSOR 100 operates at frequency $f_0$. The value $C = Y_1$ represents the value that would have been present at the output of delay 102 if the frequency was $f_1$ instead of $f_0$ on the previous sampling increment, given that $S_1 = S_0$. From FIG. 2, a transition from frequency $f_0$ to frequency $f_1$ exists without a phase discontinuity and without a change in amplitude by maintaining $S_1 = S_0$ at phase $\theta_{S1} = \theta_{S0}$, provided that the value $C = Y_1$ is substituted for the value $Y_0$ to determine the next value of S at frequency $f_1$ (i.e., the operation shown in FIG. 1 corresponding to passing the correction value C at the current sample increment).

The relation of equation (5) might be as shown in FIG. 2:

$C = b \sin(\theta_{S0} - \Delta\theta_1)$ $C = b \sin(\theta_{S0} - 2\pi f_1/f_s)$ $$C = b \sin(\theta_{S0})\cos(2\pi f_1/f_s) - b \cos(\theta_{S0})\sin(2\pi f_1/f_s), \tag{5}$$

and equation (6) is given as follows by substituting $S_0$ along with parameters $A_1$ and $B_1$ as calculated from equations (2) and (3) for frequency $f_1$:

$$C = \left(\frac{S_0 A_1}{2}\right) - B_1 \cos(\theta_{S0}). \tag{6}$$

The relation of equation (7) might be as shown in FIG. 2:

$Y_0 = b \sin(\theta_{S0} - \Delta\theta_0)$ $Y_0 = b \sin(\theta_{S0} - 2\pi f_0/f_s)$ $$Y_0 = b \sin(\theta_{S0})\cos(2\pi f_0/f_s) - b \cos(\theta_{S0})\sin(2\pi f_0/f_s). \tag{7}$$

Solving for $\cos(\theta_{S0})$ and again substituting parameters $A_0$ and $B_0$ from equations (2) and (3) for frequency $f_1$ provides equation (8):

$$\cos(\theta_{S0}) = \left(\frac{1}{B_0}\right)\left[\frac{S_0 A_0}{2} - Y_0\right]. \tag{8}$$

Substituting from equation (8) into Equation (6) while maintaining constant amplitude b provides equation (4):

$$C = \left(\frac{S_0 A_1}{2}\right) - \left(\frac{B_1}{B_0}\right)\left[\left(\frac{S_0 A_0}{2}\right) - Y_0\right]. \tag{4}$$

Other embodiments of the present invention might apply correction value C directly to combiner 101. In such embodiment, output value Y is coupled to the input of delay 103. Correction value C is i) generated with values of S and Y before the transition ($S_0$ and $Y_0$) and ii) applied directly to combiner 101 at the next sampling increment. The correction logic for such embodiment operates in a manner similar to that described for correction logic 106 of FIG. 1 and equation (4). Alternative embodiments might implement the digital operations of the figures and equation (4) entirely or in part as steps in a software program.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, whether stored in a non-transitory storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine apparatus becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or apparatus of the present invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

I claim:

1. Method of changing an oscillating signal from a first frequency to a second frequency, the method comprising the steps of:
    generating, by a circuit-based resonator, the oscillating signal at the first frequency based on a first set of parameters;
    generating, by the resonator, a correction value for the oscillating signal at a second frequency based on the first set of parameters and a second set of parameters;
    switching, by the resonator, the oscillating signal from the first frequency to the second frequency at a current sample increment; and
    applying, by the resonator, the correction value to the oscillating signal at a subsequent sample increment.

2. The invention of claim 1, wherein,
    for the step of generating the oscillating signal at the first frequency, the first set of parameters characterizes the first frequency relative to i) a sampling frequency and the first frequency and ii) an amplitude of the oscillating signal at the first frequency; and
    for the step of generating the correction value for the oscillating signal at the second frequency the second set of parameters characterizes the second frequency relative to i) the sampling frequency and the second frequency and ii) an amplitude of the oscillating signal at the second frequency.

3. The invention of claim 2, wherein the step of applying the correction value applies the correction value so as to maintain continuous phase of the oscillating signal between the first frequency and the second frequency.

4. The invention of claim 1, wherein the step of generating the oscillating signal generates the oscillating signal based on a second order resonator.

5. The invention of claim 1, comprising the step of generating the first set of parameters as $A_0$ and $B_0$ and the second set of parameters as $A_1$ and $B_1$ by the relations:

$$A_k = 2\cos(2\pi f_k/f_s), \text{ and}$$

$$B_k = b\sin(2\pi f_k/f_s),$$

where $f_k$ is the first frequency when k=0 and the second frequency when k=1, $f_s$ is a sampling frequency and b is a peak amplitude of the oscillating signal.

6. The invention of claim 5, wherein the step of generating the correction value generates the correction values as C based on the relation:

$$C = \left(\frac{S_0 A_1}{2}\right) - \left(\frac{B_1}{B_0}\right)\left[\left(\frac{S_0 A_0}{2}\right) - Y_0\right],$$

where $S_0$ is an output value of the oscillating signal at the first frequency at the subsequent sample increment and $Y_0$ is an output value of the oscillating signal at the first frequency at the current sample increment.

7. The invention of claim 5, wherein $A_k$ is a feedback coefficient in a feedback loop of the resonator and $B_k$ is an initial input value to the resonator.

8. Apparatus for changing an oscillating signal from a first frequency to a second frequency, the apparatus comprising:
    a resonator configured to generate the oscillating signal at the first frequency based on a first set of parameters;
    correction logic coupled to the resonator and configured to generate a correction value for the oscillating signal at a second frequency based on the first set of parameters and a second set of parameters;

wherein, the resonator is further configured to i) change the oscillating signal from the first frequency to the second frequency at a current sample increment; and ii) apply the correction value to the oscillating signal at a subsequent increment.

9. The invention of claim 8, wherein:
the first set of parameters characterizes the first frequency relative to i) a sampling frequency and the first frequency and ii) an amplitude of the oscillating signal at the first frequency; and
the second set of parameters characterizes the second frequency relative to i) the sampling frequency and the second frequency and ii) an amplitude of the oscillating signal at the second frequency.

10. The invention of claim 9, wherein the correction logic applies the correction value so as to maintain continuous phase of the oscillating signal between the first frequency and the second frequency.

11. The invention of claim 8, wherein the resonator is a second order resonator.

12. The invention of claim 8, wherein the first set of parameters are given as $A_0$ and $B_0$ and the second set of parameters are given as $A_1$ and $B_1$ by the relations:

$$A_k = 2\cos(2\pi f_k/f_s), \text{ and}$$

$$B_k = b\sin(2\pi f_k/f_s),$$

where $f_k$ is the first frequency when k=0 and the second frequency when k=1, $f_s$ is a sampling frequency and b is a peak amplitude of the oscillating signal.

13. The invention of claim 12, wherein the correction logic generates the correction value as C based on the relation:

$$C = \left(\frac{S_0 A_1}{2}\right) - \left(\frac{B_1}{B_0}\right)\left[\left(\frac{S_0 A_0}{2}\right) - Y_0\right],$$

where $S_0$ is an output value of the oscillating signal at the first frequency at the subsequent sample increment and $y_0$ is an output value of the oscillating signal at the first frequency at the current sample increment.

14. The invention of claim 12, wherein $A_k$ is a feedback coefficient in a feedback loop of the resonator and $B_k$ is an initial input value to the resonator.

15. The invention of claim 8, wherein the apparatus is embodied in an integrated circuit.

16. A non-transitory machine-readable medium, having encoded thereon program code, wherein, when the program code is executed by a machine, the machine implements a method for switching an oscillating signal from a first frequency to a second frequency, comprising the steps of:

generating the oscillating signal at the first frequency based on a first set of input parameters, wherein the first set of input parameters characterizes the first frequency relative to i) a sampling frequency and the first frequency and ii) an amplitude of the oscillating signal at the first frequency;

generating a correction value for the oscillating signal at a second frequency based on the first set of input parameters and a second set of input parameters, wherein the second set of input parameters characterizes the second frequency relative to i) the sampling frequency and the second frequency and ii) an amplitude of the oscillating signal at the second frequency;

switching the oscillating signal from the frequency to the second frequency at a current sample increment; and applying the correction value to the oscillating signal at a subsequent sample increment.

* * * * *